United States Patent
Kim et al.

(10) Patent No.: US 8,334,554 B2
(45) Date of Patent: Dec. 18, 2012

(54) IMAGE SENSOR AND METHOD OF MANUFACTURING THE SAME

(75) Inventors: Sung-Kwan Kim, Hwaseong-si (KR); June-Taeg Lee, Suwon-si (KR); Jeong-Wook Ko, Yongin-si (KR); Jung-Saeng Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 365 days.

(21) Appl. No.: 12/380,844

(22) Filed: Mar. 4, 2009

(65) Prior Publication Data

US 2009/0224347 A1 Sep. 10, 2009

(30) Foreign Application Priority Data

Mar. 4, 2008 (KR) .................. 10-2008-0020164

(51) Int. Cl.
*H01L 31/062* (2006.01)
*H01L 31/113* (2006.01)

(52) U.S. Cl. ........ 257/294; 257/290; 257/291; 257/432; 257/E31.11; 257/E31.121; 250/208.1

(58) Field of Classification Search ................ 250/208.1
See application file for complete search history.

(56) References Cited

U.S. PATENT DOCUMENTS

| 2006/0011813 A1* | 1/2006 | Park et al. ............... 250/208.1 |
| 2006/0023313 A1* | 2/2006 | Kim ............................ 359/620 |
| 2006/0043261 A1* | 3/2006 | Matsuda et al. ......... 250/208.1 |

OTHER PUBLICATIONS

Korean Patent Publication No. 1020050031300 to Ryu, having Publication date of Apr. 6, 2005 (w/ English Abstract page).
Korean Patent Publication No. 1020060077144 to Ryu, having Publication date of Jul. 5, 2006 (w/ English Abstract page).
Japanese Patent Publication No. JP2006073558 to Yohei et al., having Publication date of Mar. 16, 2006 (w/ English Abstract page).

\* cited by examiner

*Primary Examiner* — Evan Pert
*Assistant Examiner* — Leslie Pilar Cruz

(57) ABSTRACT

An image sensor includes a first region of a substrate having photoelectric conversion elements formed therein, and includes a second region of the substrate outside of the first region. The image sensor includes a plurality of lenses, a plurality of embossing structures, and a protective layer. The lenses are formed over the first region. The embossing structures are formed over the second region, and the embossing structures are separated from each-other. The protective layer is formed over the lenses and the embossing structures that prevent crack propagation.

18 Claims, 11 Drawing Sheets

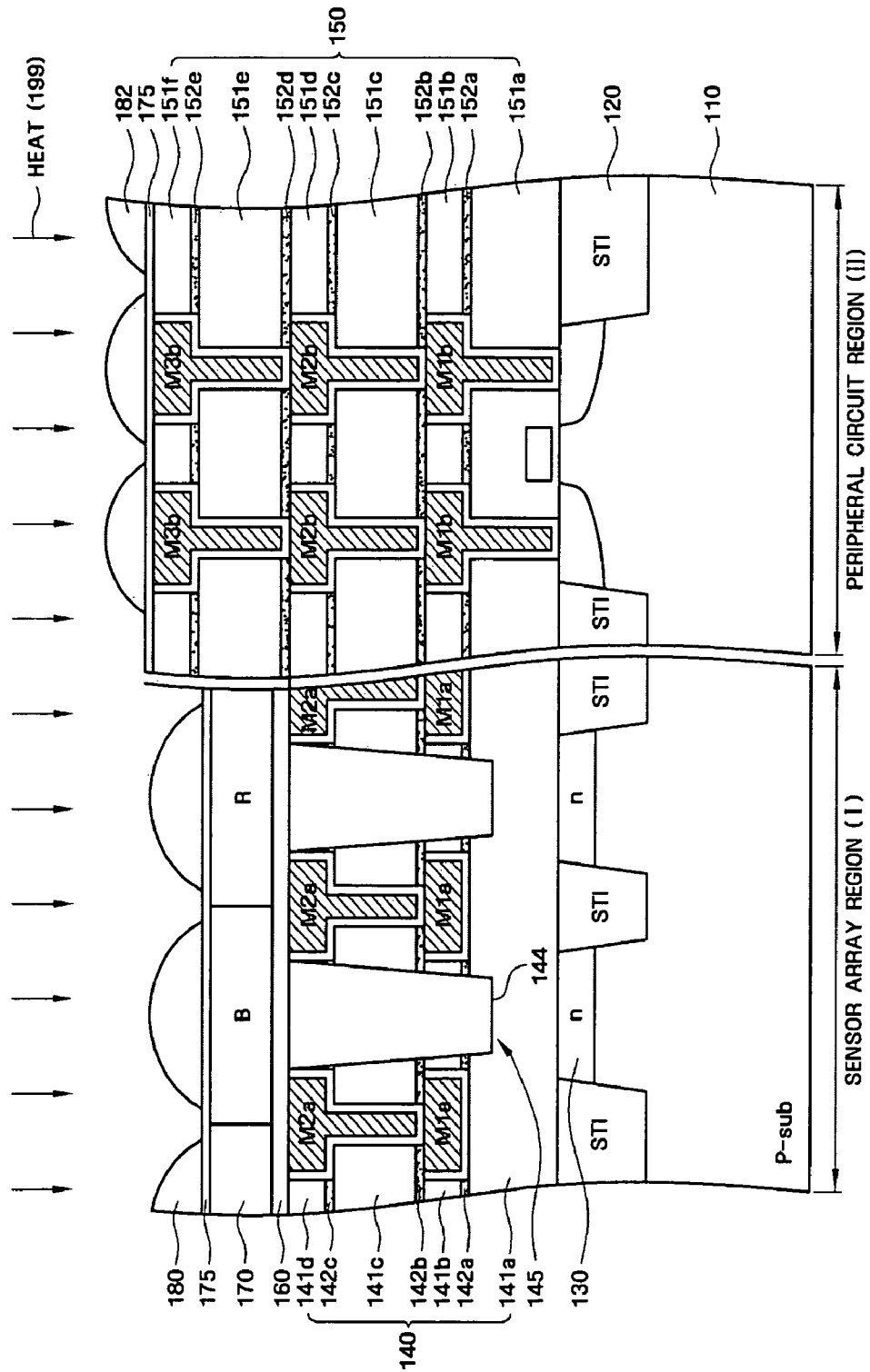

IMAGE SENSOR AND METHOD OF MANUFACTURING THE SAME

This application claims priority under 35 USC §119 to Korean Patent Application No. 10-2008-0020164, filed on Mar. 4, 2008 in the Korean Intellectual Property Office, the disclosure of which is incorporated herein in its entirety by reference.

BACKGROUND OF THE INVENTION

1. Field of the Invention

The present invention relates generally to image sensors, and more particularly to an image sensor with embossing structures for minimization of cracking in a protective layer.

2. Background of the Invention

An image sensor converts an optical image into electrical signals. With development of computer and communication industries in recent years, advanced image sensors are widely used in various devices such as digital cameras, camcorders, PCSs (Personal Communication Systems), game machines, security cameras, medical micro cameras, and the like.

A MOS (metal oxide semiconductor) image sensor is driven by a simple driving method and may be implemented with various scanning methods. The MOS image sensor has a signal processing circuit integrated as a single chip for reduced product size. In addition, fabrication of the MOS image sensor using MOS process technologies ensures low manufacturing costs. Furthermore, the MOS image sensor has low power consumption for application in a product with limited battery capacity. Additionally with development of technology, the MOS image sensor has high resolution such that the MOS image sensor is increasingly used.

The MOS image sensor includes a pixel array region having a plurality of unit pixels and includes a peripheral circuit region having circuits for controlling and driving the plurality of unit pixels. The pixel array region includes a plurality of photoelectric conversion elements and a plurality of MOS transistors. The peripheral circuit region includes a plurality of MOS transistors. The pixel array region and the peripheral circuit region are integrated in a single substrate with the MOS transistors in such regions being simultaneously formed.

For increasing collection efficiency, lenses are formed for corresponding photoelectric conversion elements in the pixel array region. A protective layer of LTO (Low Temperature Oxide) is formed over the lenses. During packaging, the MOS image sensor may undergo thermal and mechanical stress. Such thermal and mechanical stress may cause a crack in the protective layer. The crack may extend from the peripheral circuit region to the pixel array region. Such a crack may adversely affect on the path of incident light with deterioration of optical characteristics of the MOS image sensor.

SUMMARY OF THE INVENTION

Accordingly, embossing structures are formed in the peripheral circuit region for minimization of cracking in the image sensor.

An image sensor of an aspect of the present invention includes a first region of a substrate having photoelectric conversion elements formed therein, and includes a second region of the substrate outside of the first region. In addition, the image sensor includes a plurality of lenses, a plurality of embossing structures, and a protective layer. The lenses are formed over the first region. The embossing structures are formed over the second region, and the embossing structures are separated from each-other. The protective layer is formed over the lenses and the embossing structures.

In an embodiment of the present invention, the protective layer is formed onto the lenses and the embossing structures to contact the lenses and the embossing structures.

In a further embodiment of the present invention, the image sensor further includes a planarization film formed in the first and second regions. The lenses are formed on the planarization film in the first region, and the embossing structures formed on the planarization film in the second region.

In another embodiment of the present invention, the protective layer is formed onto portions of the planarization film between the embossing structures in the second region, and is formed onto portions of the planarization film between the lenses in the first region.

In a further embodiment of the present invention, the lenses and the embossing structures are comprised of a same material such as an organic material.

In another embodiment of the present invention, the lenses and the embossing structures have a same shape.

In an example embodiment of the present invention, the embossing structures are shaped as an array of lenses, an array of pyramids, or a plurality of bars.

In a further embodiment of the present invention, the protective layer is comprised of an inorganic oxide. In another embodiment of the present invention, the protective layer is comprised of a LTO (Low Temperature Oxide).

In an example embodiment of the present invention, the image sensor further includes first insulating structures with first multilayer interconnects formed under the lenses in the first region, and includes second insulating structures with second multilayer interconnects formed under the embossing structures in the second region.

In a further embodiment of the present invention, the lenses are formed for the photoelectric conversion elements.

In an example embodiment of the present invention, the first region is a pixel array region of the image sensor, and the second region is a peripheral circuit region of the image sensor.

In another embodiment of the present invention, the lenses in the first region are at a different height from the embossing structures in the second region. For example, the lenses in the first region are at a lower height from the embossing structures in the second region.

In an embodiment of the present invention, the image sensor further includes a respective light-transmissive portion and a respective color filter formed over each photoelectric conversion element and below a respective lens in the first region. For example, the photoelectric conversion elements are photodiodes.

The present invention may be used to particular advantage when the image sensor is a MOS (metal oxide semiconductor) image sensor. However, the present invention may also be used for other types of image sensors.

In this manner, the embossing structures provide increased surface area for contact to the protective layer to result in higher surface energy of the protective layer. Such increased surface energy of the protective layer prevents a crack from propagating into the pixel array region from the peripheral circuit region.

BRIEF DESCRIPTION OF THE DRAWINGS

The above and other features and advantages of the present invention will become more apparent when described in detailed exemplary embodiments thereof with reference to the attached drawings in which:

FIGS. 9A and 9B show cross-sectional views across the pixel array region and the peripheral circuit region of FIG. 3 during fabrication of the image sensor, according to an embodiment of the present invention.

The figures referred to herein are drawn for clarity of illustration and are not necessarily drawn to scale. Elements having the same reference number in FIGS. 1, 2, 3, 4, 5, 6, 7, 8, 9A, 9B, and 10 refer to elements having similar structure and/or function.

DETAILED DESCRIPTION OF THE INVENTION

Figure 1:
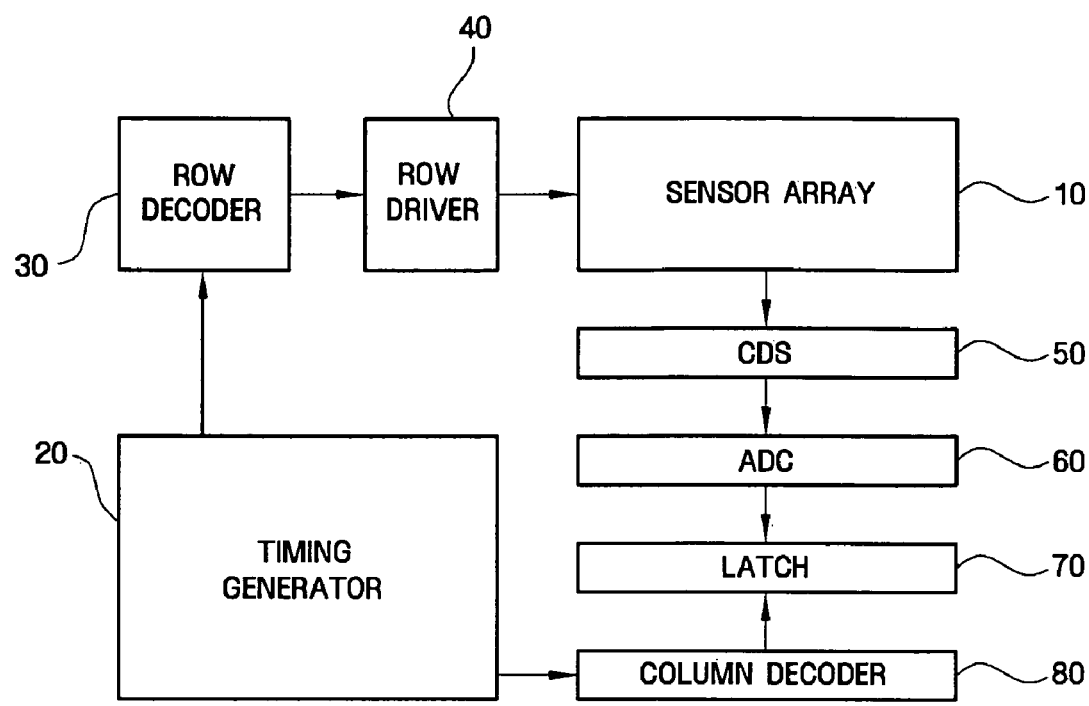
FIG. 1 is a block diagram of an image sensor, according to an embodiment of the present invention.

The present invention is now described more fully with reference to the accompanying drawings, in which exemplary embodiments of the invention are shown. However, the invention may be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements.

Similarly, if the device in one of the figures is turned over, elements described as "below" or "beneath" other elements would then be oriented "above" the other elements. Therefore, the exemplary terms "below" and "beneath" can encompass both an orientation of above and below.

FIG. 1 is a block diagram of an image sensor according to an example embodiment of the present invention. The image sensor of FIG. 1 includes a sensor array 10, a timing generator 20, a row decoder 30, a row driver 40, a correlated double sampler (CDS) 50, an analog-to-digital converter (ADC) 60, a latch 70, and a column decoder 80. The sensor array 10 includes a plurality of unit pixels arranged in a two-dimensional matrix.

Each unit pixel has a respective photoelectric conversion element such that the sensor array 10 converts optical images into electrical signals. The sensor array 10 is driven with a plurality of driving signals, such as row selection signals, reset control signals, and transfer control signals from the row driver 40. The electrical signals from the sensor array 10 are received by the correlated double sampler 50 through vertical signal lines.

The timing generator 20 supplies timing control signals to the row decoder 30 and the column decoder 80. The row driver 40 supplies a plurality of driving signals for driving the plurality of unit pixels in the sensor array 10 according to the decoding result of the row decoder 30. In general, when the unit pixels are arranged as a two-dimensional matrix, the driving signals are supplied by row.

The correlated double sampler 50 samples and holds the electrical signals generated by the sensor array 10 through the vertical signal lines. In particular, the correlated double sampler 50 samples a noise level and a signal level of each output signal from the sensor array 10 to generate a difference between such noise and signal levels.

The analog-to-digital converter 60 converts such a difference that is an analog signal into a digital signal to generate a converted digital signal. The latch 70 latches the digital signal that is then sequentially output to an image signal processor (not shown) according to the decoding result of the column decoder 80.

Figure 2:
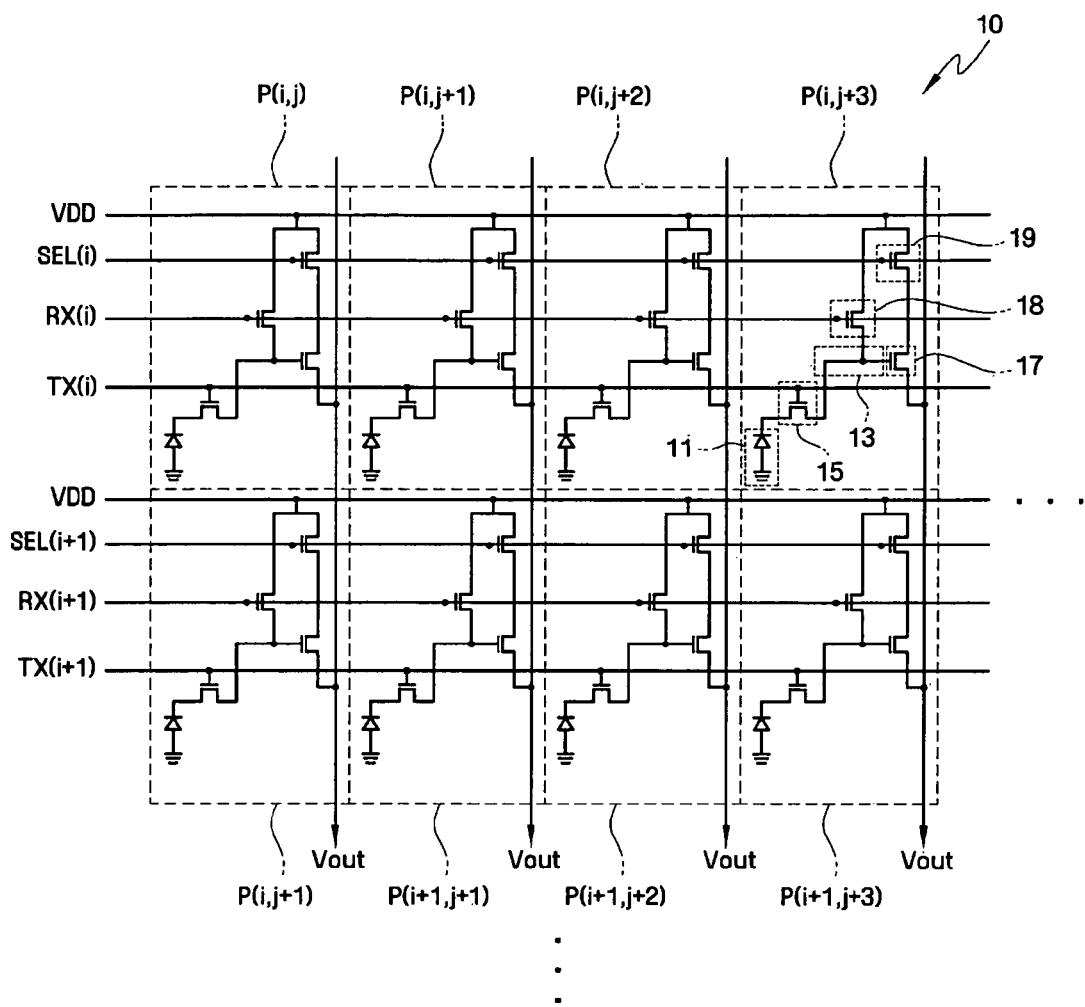
FIG. 2 shows a circuit diagram of a sensor array in the image sensor of FIG. 1, according to an embodiment of the present invention.

FIG. 2 shows a circuit diagram of the sensory array 10 of FIG. 1, according to an embodiment of the present invention.

Referring to FIG. 2, pixels P are arranged in a two-dimensional matrix to form the sensor array 10. Each pixel P includes a respective photoelectric conversion element 11, a respective floating diffusion region 13, a respective charge transfer element 15, a respective drive element 17, a respective reset element 18, and a respective selection element 19. The operation of such elements is now described for the pixels of an i-th row (i.e., P(i, j), P(i, j+1), P(i, j+2), P(i, j+3), . . . ).

The charge transfer element 15, the drive element 17, the reset element 18, and the selection element 19 are MOSFETs (metal oxide semiconductor field effect transistors) such that the image sensor of FIG. 1 is a MOS (metal oxide semiconductor) image sensor in an example embodiment of the present invention. However, the present invention may also be applied to other types of image sensors.

The photoelectric conversion element 11 receives incident light and accumulates an amount of electric charge corresponding to the intensity of such incident light. The photoelectric conversion element 11 may be a photodiode, a phototransistor, a photogate, a pinned photodiode, or a combination thereof. In FIG. 2, a photodiode is illustrated.

The photoelectric conversion element 11 is coupled to the charge transfer element 15 that transfers the accumulated electric charge to the floating diffusion region 13 according to a transfer control signal applied at a transfer line TX(i). The transferred electric charge is converted into a voltage at the floating diffusion region (FD) 13. The floating diffusion region 13 has a parasitic capacitance for storing such transferred electric charge.

The drive element 17 is configured as a source follower amplifier for amplifying a change in electrical potential at the floating diffusion region 13 to generate an amplification result on an output line Vout. The reset element 18 periodically resets the floating diffusion region 13 according to a reset control signal applied at a reset line RX(i). When the reset element 18 is turned on, a reset voltage such as a power supply voltage VDD is applied at the floating diffusion region 13 through the reset element 18.

The selection element 19 selects the pixels P in a selected row to generate the electrical signals applied on the output lines Vout according to a row selection signal on a row selection line SEL(i). When the selection element 19 is turned on by such a row selection signal, the power supply voltage VDD is applied on the drain of the drive element 17 via the selection element 19. The transmission lines TX(i), the reset lines RX(i), and the row selection lines SEL(i) extend in parallel along a row direction of the sensor array 10.

Figure 3:
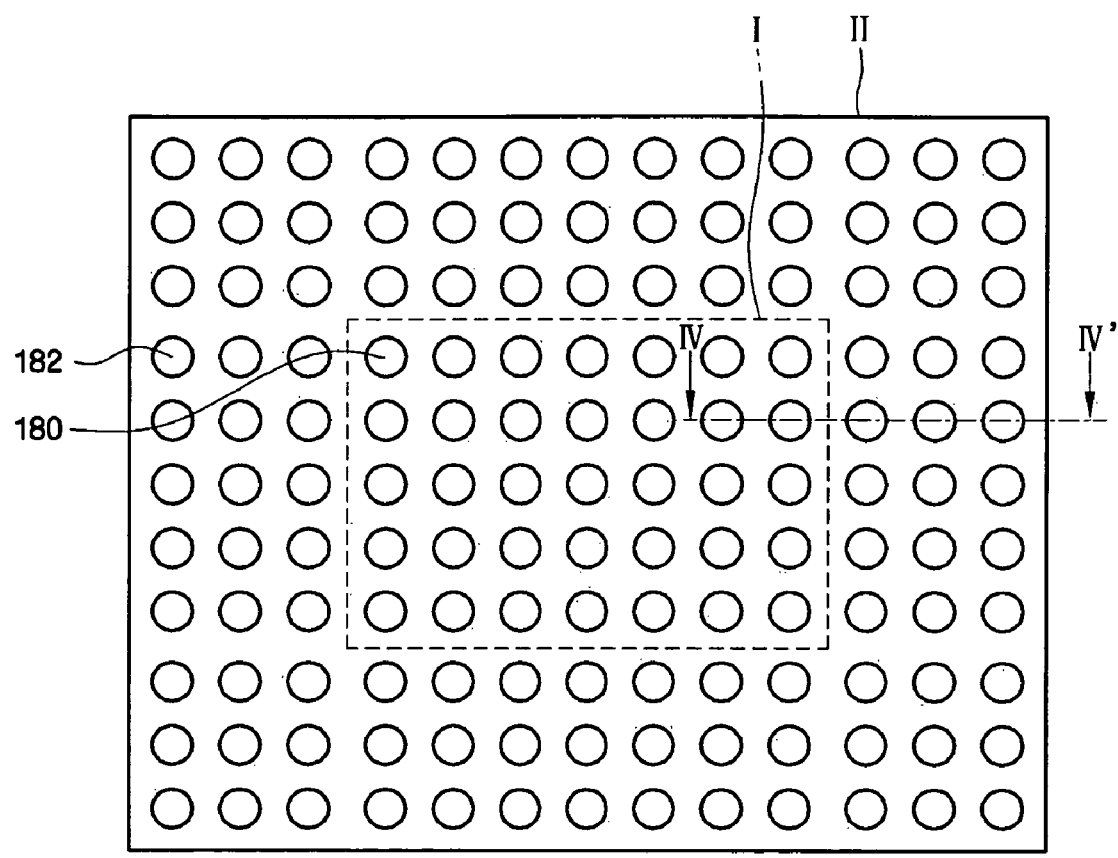
FIG. 3 shows a plan view of a pixel array region and a peripheral circuit region in the image sensor of FIG. 1, according to an embodiment of the present invention.
Figure 4:
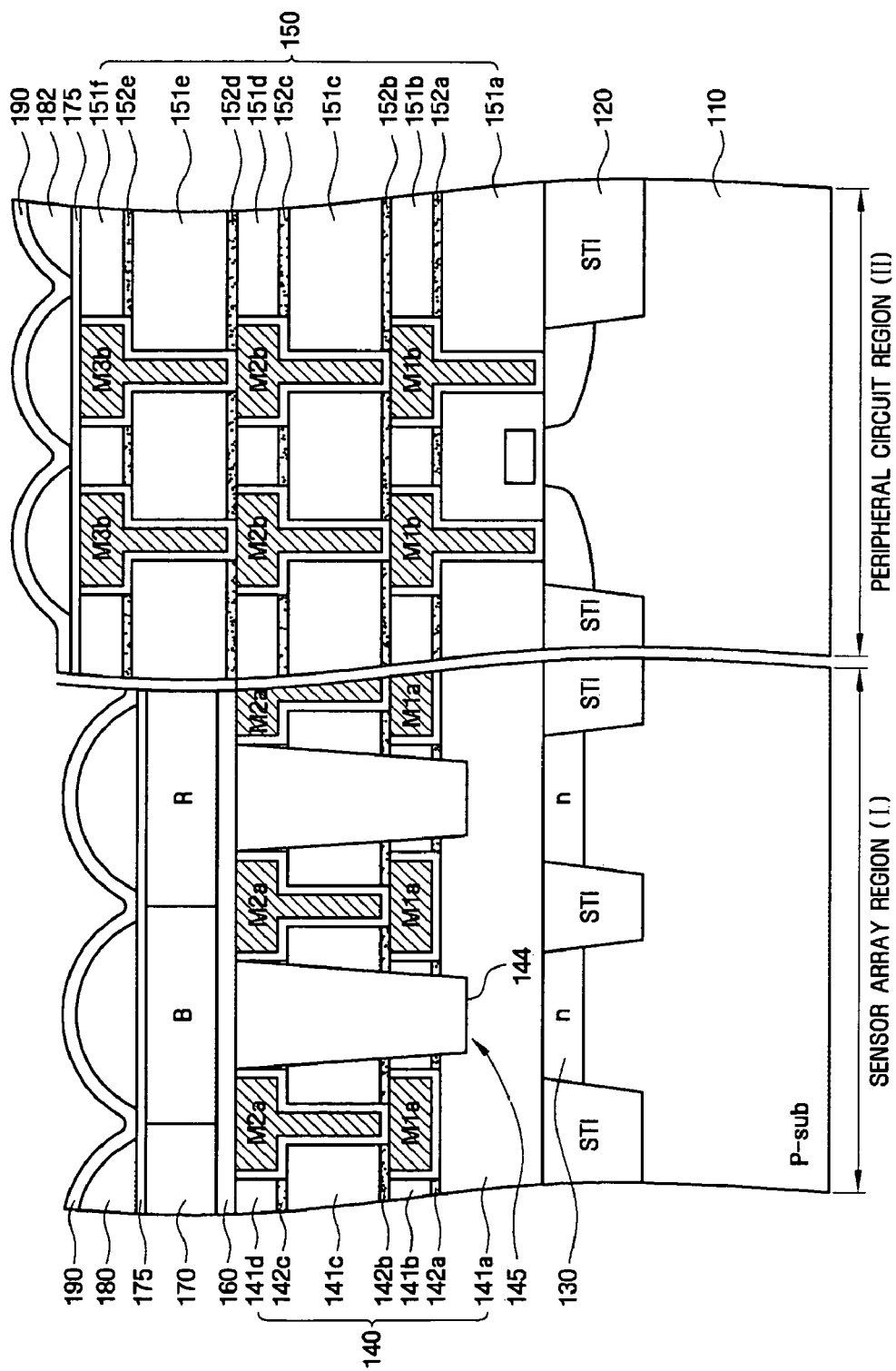
FIG. 4 shows a cross-sectional view across the pixel array region and the peripheral circuit region of FIG. 3, according to an embodiment of the present invention.

FIG. 3 shows a plan view of a pixel array region I and a peripheral circuit region II in the image sensor of FIG. 1, according to an embodiment of the present invention. FIG. 4 shows a cross-sectional view across the pixel array region I and the peripheral circuit region II along line IV-IV' in FIG. 3, according to an embodiment of the present invention.

In particular, FIG. 3 shows a top view of lenses 180 formed in the pixel array region I, and of embossing structures 182 formed in the peripheral circuit region II. Referring to FIG. 3, the pixel array region I has the sensor array 10 formed therein, and the peripheral circuit region II has the timing generator 20, the row decoder 30, the row driver 40, the correlated double sampler 50, the analog-to-digital converter 60, the latch 70, and the column decoder 80 formed therein. As shown in FIG. 3, the peripheral circuit region II is formed to surround the pixel array region I. However, the present invention is not limited thereto and may be practiced with other configurations of the peripheral circuit region II and the pixel array region I.

Referring to FIG. 4, an isolation region 120, such as a STI (Shallow Trench Isolation) region, is formed in a substrate 110. The substrate 110 may be a semiconductor substrate such as silicon substrate having a predetermined conductivity type (such as P-type for example). The isolation region 120 defines an active region of the substrate 110. The active region may be largely divided into the pixel array region I and the peripheral circuit region II.

Though not shown in the drawing, the present invention may also be practiced with an epitaxial layer formed on the substrate 110, and/or with a plurality of wells formed in the substrate 110.

A first insulating film structure 140 is formed in the pixel array region I, and a second insulating film structure 150 is formed in the peripheral circuit region II. The first insulating film structure 140 includes first multilayer interconnects (M1a, M2a) formed in first multilayer insulating structures (141a, 141b, 141c, and 141d) and first multilayer anti-diffusion films (142a, 142b, 142c). The second insulating film structure 150 includes second multilayer interconnects (M1b, M2b, M3b) formed in second multilayer interlayer insulating structures (151a, 151b, 151c, 151d, 151e, 151f and second multilayer anti-diffusion films (152a, 152b, 152c, 152d, 152e).

In an example embodiment of the present invention, the first and second multilayer interconnects (M1a, M2a) and (M1b, M2b, M3b) are comprised of copper, but the present invention is not limited thereto. The interconnect structures M2a, M1b, M2b, and M3b are dual damascene interconnect structures, but the present invention is not limited thereto.

The first and second insulating film structures 140 and 150 have different heights from the semiconductor substrate 110, but the present invention is not limited thereto. That is, the top surface of the interlayer insulating film 141d in the pixel array region I is lower than the top surface of the interlayer insulating film 151f in the peripheral circuit region II.

The number of layers of the first multilayer interconnects with two layers (M1a, M2a) is less than the number of layers of the second multilayer interconnects with three layers (M1b, M2b, M3b), but the present invention is not limited thereto. In that case, an unnecessary interlayer insulating film in the pixel array region I formed on the second layer M2a is etched or removed such that the top surface of the first insulating film structure 140 is lower than the top surface of the second insulating film structure 150.

Accordingly, the amount of light reaching the photoelectric conversion element 130 is increased resulting in high sensitivity of the image sensor. For further enhanced sensitivity of the image sensor, a respective light-transmissive portion 145 is formed through the first insulating film structure 140 over each photoelectric conversion element 130.

In an example embodiment of the present invention, the anti-diffusion films 142a, 142b, and 142c are comprised of silicon nitride having low light-transmittance. Thus, openings 144 are formed through the interlayer insulating films 141a, 141b, 141c, and 141d and the anti-diffusion films 142a, 142b, and 142c for removal of such material over the photoelectric conversion elements 130. Thereafter, the openings 144 are filled with a light-transmissive material (for example an organic polymer compound such as a polymer of fluorine series having a ring structure (Cytop™ for example) or a polymer of PMMA series) to form the light-transmissive portions 145.

In FIG. 4, the opening 144 is illustrated as being formed through a portion of the interlayer insulating film 141a. However, the present invention is not limited thereto. Also in FIG. 4, the opening 144 is illustrated as having inclined sidewalls and a flat bottom surface, but the present invention is not limited thereto. For example, the present invention may also be practiced with the opening 144 not having an inclined sidewall and/or not having a flat bottom surface. For example, the opening 144 may have a concave or convex bottom surface.

On the first insulating film structure 140, a lower planarization film 160, color filters 170, an upper planarization film 175, and lenses 180 are sequentially formed. On the second insulating film structure 150, the upper planarization film 175 and the embossing structures 182 are sequentially formed.

A protective layer 190 is conformally deposited on exposed surfaces of the lenses 180 and the upper planarization film 175 in the pixel array region I, and on exposed surfaces of the embossing structures 182 and the planarization film 175 in the peripheral circuit region II. In the example of FIG. 4, the planarization films 160 and 175 are formed above and below the color filters 170, but the present invention is not limited thereto. For example, the present invention may be practiced with only the planarization film 175 above the color filters 170 being formed, or with no planarization film being formed above and below the color filters 170.

The lenses 180 are comprised of an organic material, such as PR (photoresist) in an example embodiment of the present invention. However, the present invention may also be practiced with the lenses 180 being comprised of an inorganic material. When the lenses 180 are comprised of an organic material, as described below with reference to FIGS. 9A and 9B, the lenses 180 may be simply formed by using heat treatment.

The protective layer 190 is comprised of an inorganic oxide in an example embodiment of the present invention. Examples of such an inorganic oxide include silicon oxide ($SiO_2$), titanium oxide ($TiO_2$), zirconium oxide ($ZrO_2$), hafnium oxide film ($HfO_2$), a laminate of such oxides, or a combination of two or more of them. In particular, the protective layer 190 is preferably comprised of LTO (Low Temperature Oxide) as an example of silicon oxide. LTO that is fabricated at a low temperature (such as in a range of from about 100° C. to about 200° C.) has higher density for preventing damage to underlying structures. Furthermore, LTO is amorphous and thus is not rough such that reflection, refraction, and scattering of incident light is minimized.

The lenses 180 that are comprised of an organic material are vulnerable to external impact. The protective layer 190 protects the lenses 180 against such external impact. In addition, the protective layer 190 fills a space which may exist between adjacent lenses 180. If the space between the adjacent lenses 180 is filled, the collection efficiency of incident light may be increased. This is because reflection, refraction, and scattering of incident light through the space between adjacent lenses 180 may be minimized.

In an embodiment of the present invention, the embossing structures 182 are formed onto the upper planarization film 175 over the second insulating film structure 150. In addition, a plurality of the embossing structures 182 are formed to be separated from each-other such that portions of the upper planarization film 175 are exposed after formation of the embossing structures 182 thereon.

In this manner, the protective layer 190 is formed onto the embossing structures 182 and portions of the upper planarization film 175 to contact the embossing structures 182 and the upper planarization film 175 in the peripheral circuit region II. Similarly, the protective layer 190 is formed onto the lenses 180 and portions of the upper planarization film 175 to contact the lenses 180 and the upper planarization film 175 in the pixel array region I.

When the image sensor is packaged, the image sensor may undergo thermal and mechanical stress. Such thermal and/or mechanical stress may cause a crack in the protective layer 190. In general, the crack tends to be generated in a portion of the protective layer 190 on the second insulating film structure 150 and then propagates to a portion of the protective layer 190 on the first insulating film structure 190. Such a crack in the pixel array region I may adversely affect the path of incident light to the photodiodes 130.

In an aspect of the present invention, the embossing structures 182 formed below the protective layer 190 in the peripheral circuit region II prevent a crack generated in a portion of the protective layer 190 in the peripheral circuit region II from propagating into a portion of the protective layer 190 and the first insulating film structure 140 in the pixel array region I. Such prevention of crack propagation results from increased surface energy of the protective layer 190 from increased contact area between the protective layer 190 and the embossing structures 182.

In a first embodiment of the present invention as shown in FIGS. 3 and 4, the embossing structures 182 are lens-shaped having a similar shape as the lenses 180. With such similar shape of the embossing structures 182 and the lenses 180, the embossing structures 182 and the lenses 180 may be simultaneously formed for easy formation of the embossing structures 182. However, the present invention is not limited thereto, and the present invention may be practiced with the embossing structures 182 not necessarily being lens-shaped and having various shapes that also increase the surface energy of the protective layer 190.

In an example embodiment of the present invention, the embossing structures 182 and the lenses 180 are comprised of a same material. In an example embodiment of the present invention, the embossing structures 182 and the lenses 180 are comprised of an organic material, such as PR (photoresist). However, the present invention is not limited thereto.

In the first embodiment of the present invention, the lenses 180 are formed in the pixel array region I and the embossing structures 182 are formed in the peripheral circuit region II. However, the present invention is not limited thereto, and the present invention may be practiced with the lenses 180 being formed in a first region of the substrate 110 and the embossing structures 182 being formed in a second region of the substrate 110 outside of the first region.

Though not shown in the drawings, the present invention may also be practiced with the color filters also being formed below the embossing structures 182 in the peripheral circuit region II. Such color filters in the peripheral circuit region II may be formed simultaneously with the color filters 170 in the pixel array region I. Such color filters in the peripheral circuit region II may prevent incident light from being reflected and refracted from the peripheral circuit region II and entering the pixel array region I for suppressing crosstalk.

The photoelectric conversion elements and the read elements (that is, the charge transfer elements, the drive elements, the reset elements, and the selection elements) are formed in the pixel array region I. Other CMOS elements, resistors, and capacitors are formed in the peripheral circuit region II simultaneously with the read elements. These elements, individually and generally, are known to one of ordinary skill in the art and may be implemented in various ways. Therefore, illustrations and descriptions thereof are omitted herein.

Figure 5:
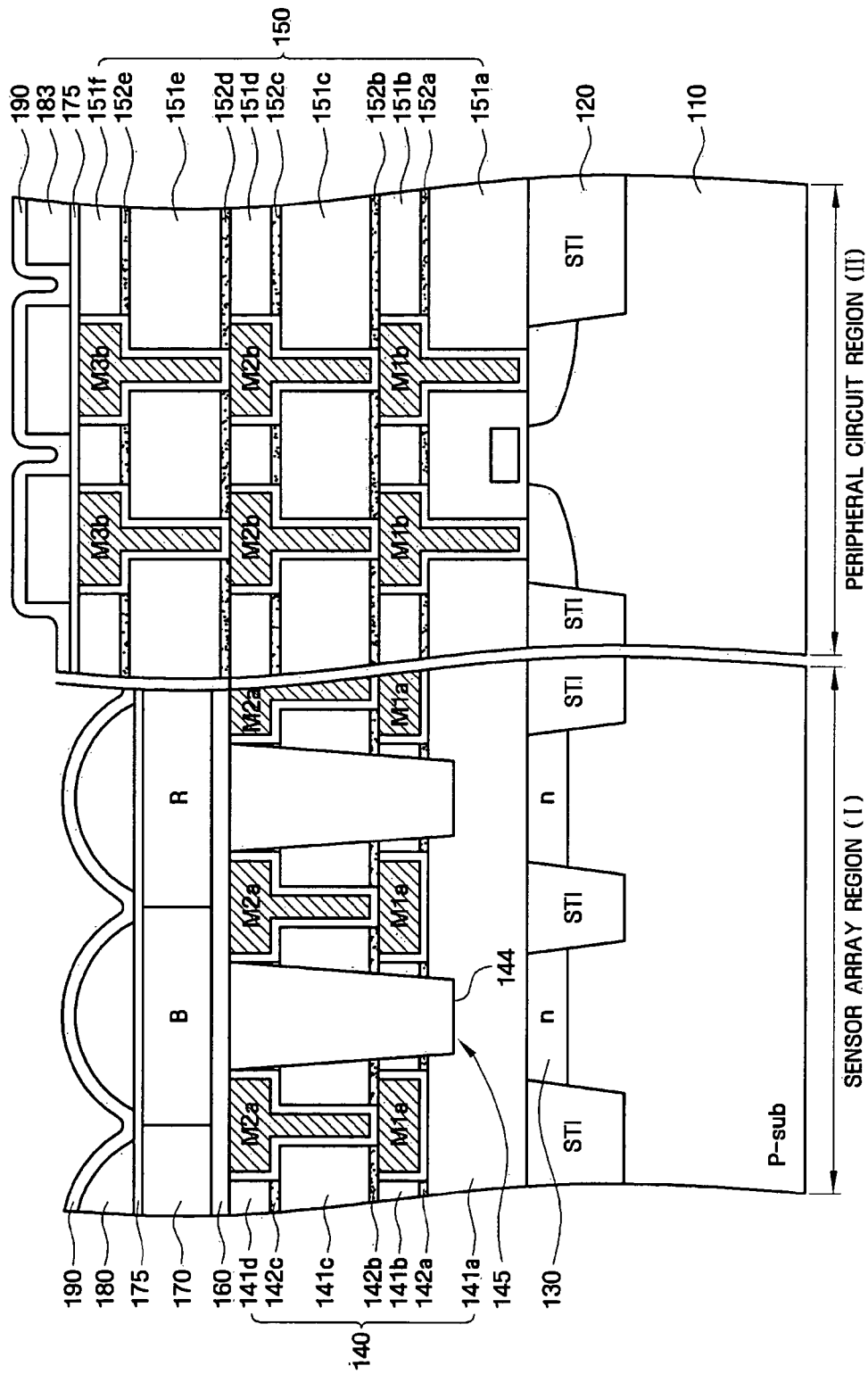
FIGS. 5 and 6 show cross-sectional views across the pixel array region and the peripheral circuit region of FIG. 3, according to alternative embodiments of the present invention.
Figure 6:
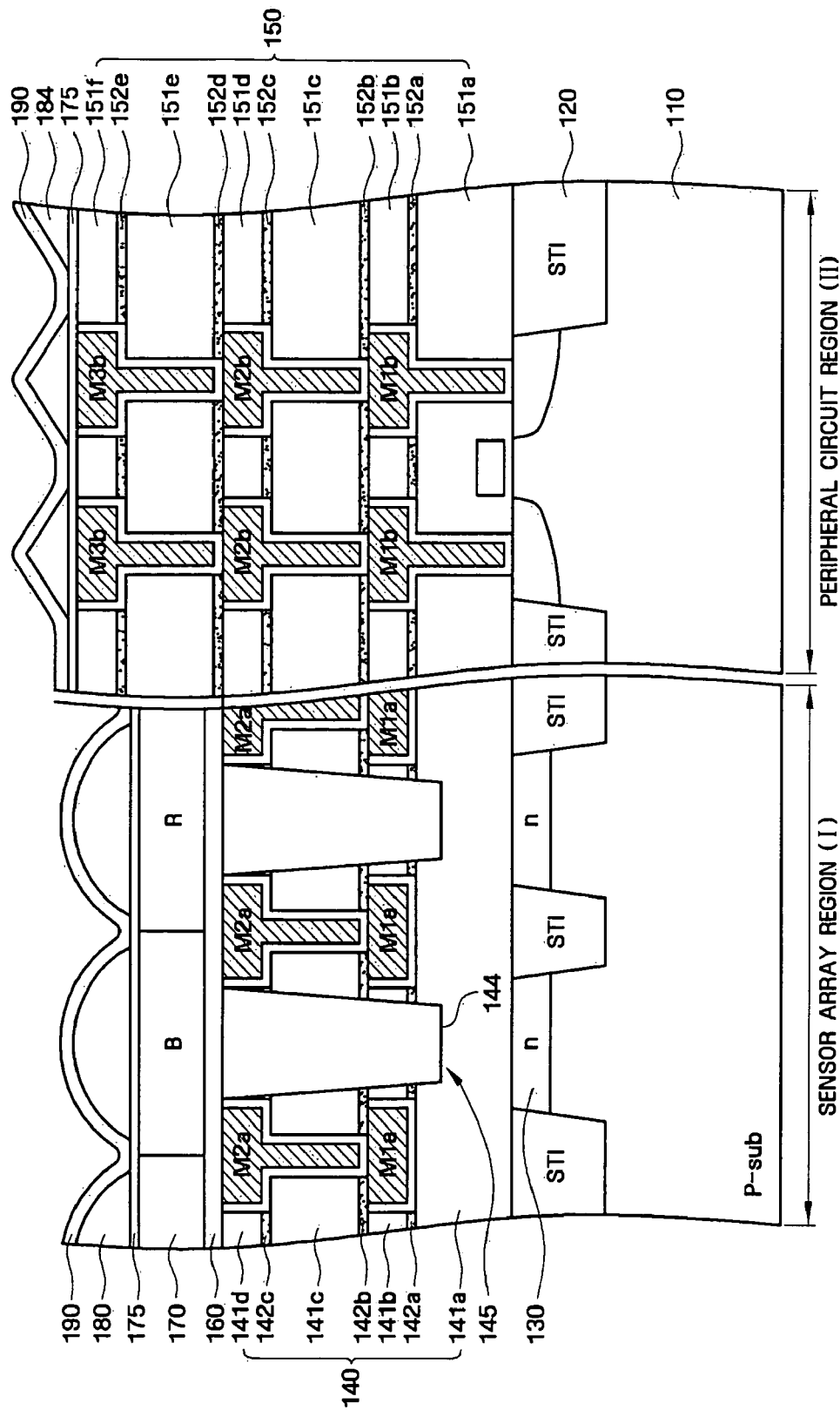
Figure 7:
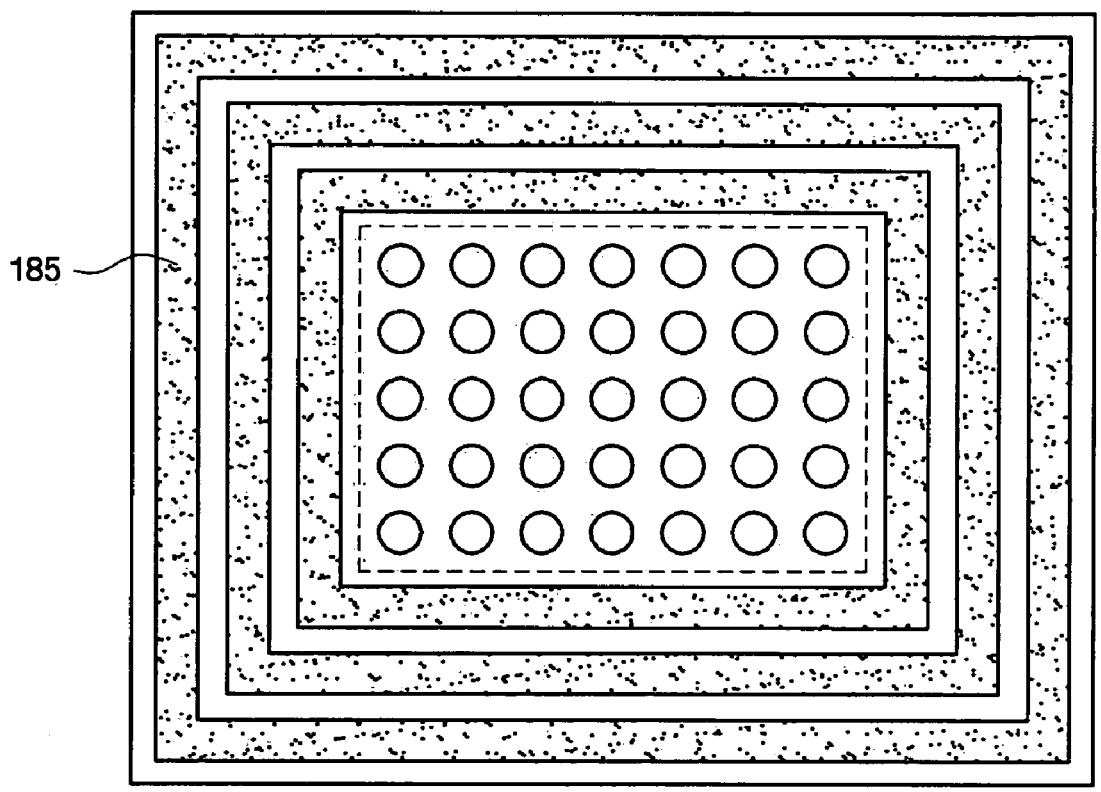
FIGS. 7 and 8 show plan views of the pixel array region and the peripheral circuit region in the image sensor of FIG. 1, according to alternative embodiments of the present invention.
Figure 8:
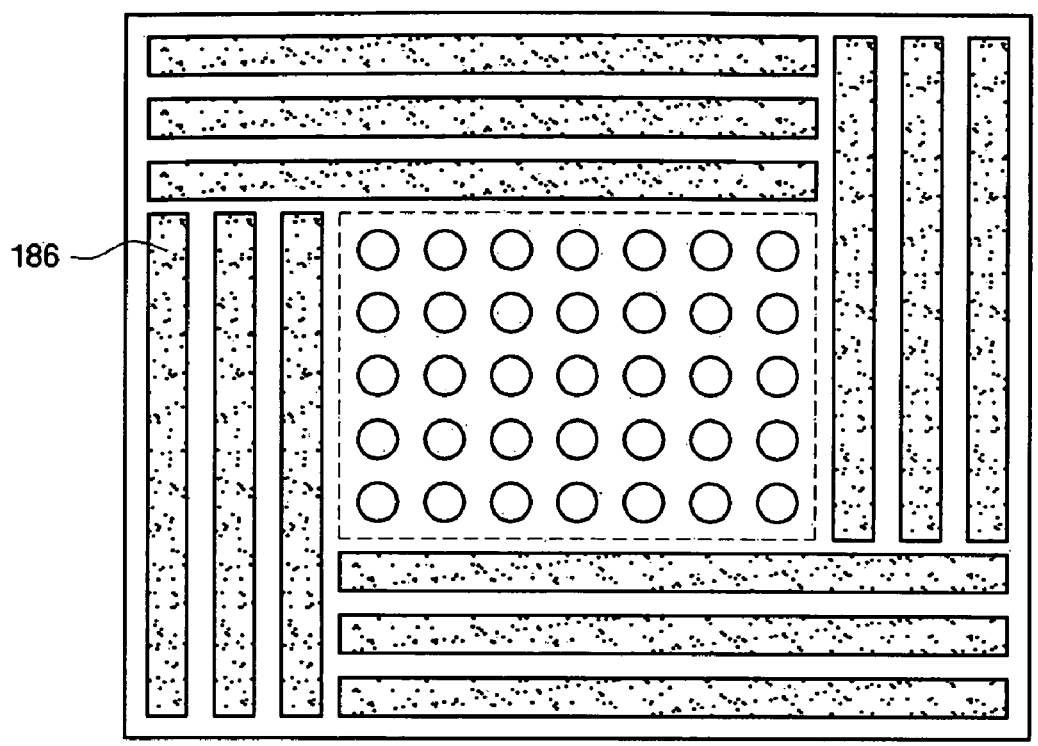

Alternative shapes of the embossing structures are now described with reference to FIGS. 5, 6, 7, and 8. However, the present invention is not limited thereto. FIGS. 5 and 6 show cross-sectional views across the pixel array region and the peripheral circuit region along lines IV-IV' of FIG. 3, according to alternative embodiments of the present invention. FIGS. 7 and 8 show plan views of the pixel array region and the peripheral circuit region in the image sensor of FIG. 1, according to alternative embodiments of the present invention.

In a second embodiment of the present invention, FIG. 5 shows square-shaped embossing structures 183 forming an array of square bars. In a third embodiment of the present invention, FIG. 6 shows triangular embossing structures 184 forming an array of pyramids. In a fourth embodiment of the present invention, FIG. 7 shows embossing structures 185 formed as a plurality of bars configured as concentric rectangular rings. In a fifth embodiment of the present invention, FIG. 8 shows embossing structures 185 formed as a plurality of rectangular bars that are disjointed from each-other. The image sensor of FIGS. 5, 6, 7, and 8 otherwise similarly include other structures of FIG. 3.

Figure 9A:
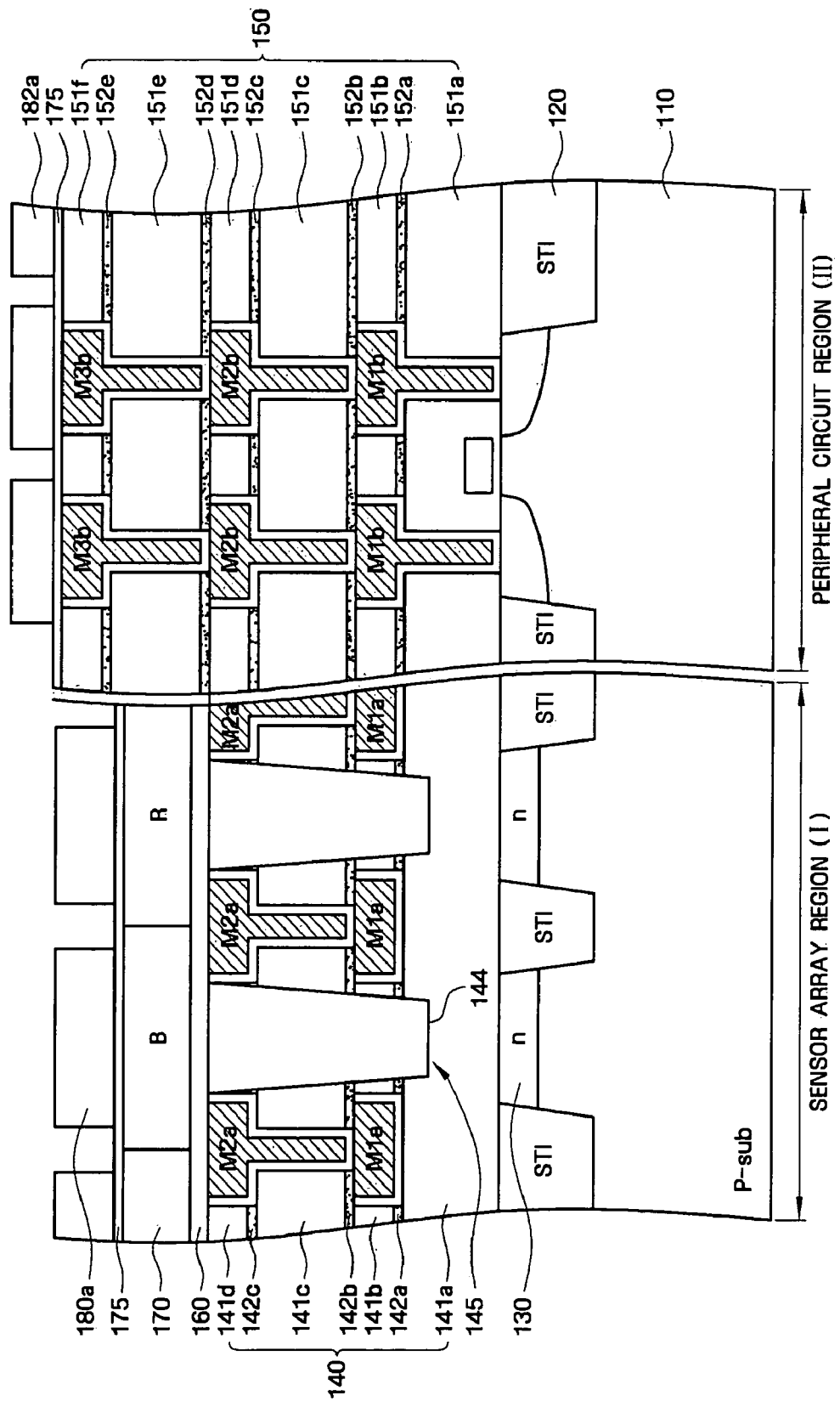

A method of manufacturing the image sensor of FIG. 4 according to the first embodiment of the present invention is now described with reference to FIGS. 9A and 9B. FIGS. 9A and 9B show cross-sectional views across the pixel array region I and the peripheral circuit region II along line IV-IV' of FIG. 3 during fabrication of the image sensor, according to an embodiment of the present invention Referring to FIG. 9A, the isolation region 120 is formed in the substrate 110 to define the pixel array region I and the peripheral circuit region II. Next, the photoelectric conversion elements 130 are formed in the pixel array region I. A plurality of read elements are formed in the pixel array region I, and a plurality of MOS elements are formed in the peripheral circuit region II.

Next, the first insulating film structure 140 is formed on the pixel array region I, and the second insulating film structure 150 is formed on the peripheral circuit region II. Portions of the first insulating film structure 140 and portions of the second insulating film structure 150 may be simultaneously formed.

Subsequently, the lower planarization film 160, the color filters 170, and the upper planarization film 175 are sequentially formed on the first insulating film structure 140. Next, an organic material pattern 180a is formed on the upper planarization film 175 in the pixel array region I, and an organic material pattern 182a is formed on the upper planarization film 175 in the peripheral circuit region II.

Thereafter referring to FIG. 9B, a heat treatment (denoted by reference numeral 199) is performed to deform the organic material patterns 180a and 182a to form the lenses 180 and the embossing structures 182, respectively. As such, the lenses 180 and the embossing structures 182 are simultaneously formed.

Returning to FIG. 4, the protective layer 190 is conformally formed onto the lenses 180 and exposed portions of the upper planarization film 175 in the pixel array region I, and onto the embossing structures 182 and exposed portions of the upper planarization film 175 in the periphery circuit region II. For example, the protective layer 190 is comprised of LTO (Low Temperature Oxide) as an example of silicon oxide, formed with a temperature in a range of from about 100° C. to about 200° C.

A method of manufacturing the image sensor of FIG. 5, 6, 7, or 8 would be apparent to one of ordinary skill in the art of image sensors from the description for the embodiment of FIG. 4 and thus a description thereof is omitted.

Figure 10:
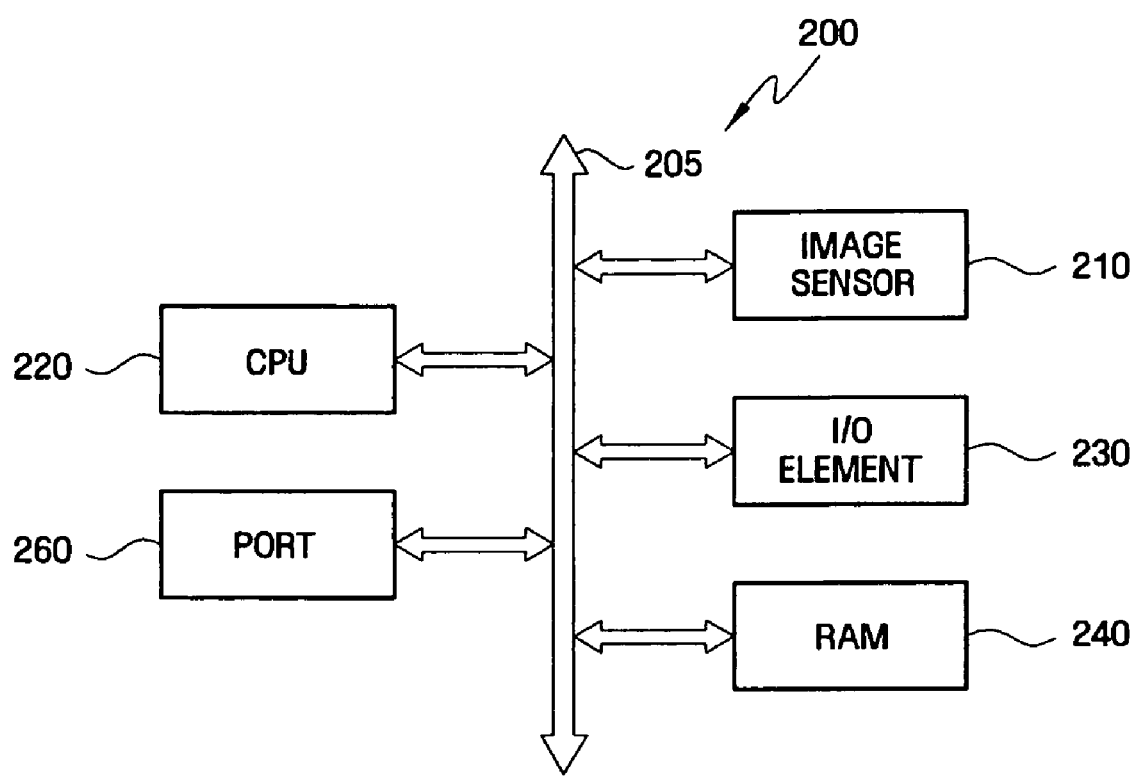
FIG. 10 shows a block diagram of a processor-based system including the image sensor of FIG. 1, according to an embodiment of the present invention.

FIG. 10 shows a block diagram of a processor-based system 200 including an image sensor 210 which may be the image sensor of FIGS. 1, 2, 3, 4, 5, 6, 7, and/or 8 according to an embodiment of the present invention. Referring to FIG. 10, the processor-based system 200 processes images as sensed by the image sensor 210 that is a CMOS (complementary metal oxide semiconductor) image sensor for example. Examples of the system 200 include a computer system, a camera system, a scanner, a mechanized clock system, a navigation system, a video phone, a surveillance system, an automatic focus system, a tracing system, a motion monitoring system, and an image stabilization system. However, the present invention is not limited thereto.

The processor-based system 200, such as a computer system, includes a central processing unit (CPU) 220, such as a microprocessor, which communicates with an input/output (I/O) element 230 through a bus 205. The CMOS image sensor 210 communicates with other components of the system 200 through the bus 205 or other communication links.

The processor-based system 200 further includes a RAM 240 and/or a port 260 that communicates with the CPU 220 through the bus 205. The port 260 may have mounted therein a video card, a sound card, a memory card, or a USB device, or may be a port that performs data communication with other systems. The CMOS image sensor 210 may be integrated together with the CPU, a digital signal processor (DSP), a microprocessor, and/or a memory. Depending on application, the CMOS image sensor 210 may be integrated in a chip different from the processor 220.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor comprising:
   a first region of a substrate having photoelectric conversion elements formed therein;
   a second region of the substrate outside of the first region;
   a plurality of lenses formed over the first region with a respective color filter formed under said lenses in the first region;
   a plurality of embossing structures formed directly over the second region without a respective color filter formed under said embossing structures in the second region, and
   a protective layer formed over the lenses and the embossing structures,
   wherein the first region is a pixel array region, and wherein the second region is a peripheral circuit region including a driver formed therein for providing driving signals that drive pixels of the pixel array region.

2. The image sensor of claim 1, wherein the protective layer is formed onto the embossing structures to contact the embossing structures.

3. The image sensor of claim 1, wherein the protective layer is formed onto the lenses and the embossing structures to contact the lenses and the embossing structures.

4. The image sensor of claim 1, wherein the lenses and the embossing structures have a same shape.

5. The image sensor of claim 1, wherein the embossing structures are shaped as an array of lenses, an array of pyramids, or a plurality of bars.

6. The image sensor of claim 1, wherein the protective layer is comprised of an inorganic oxide.

7. The image sensor of claim 1, wherein the protective layer is comprised of a LTO (Low Temperature Oxide).

8. The image sensor of claim 1, further comprising:

first insulating structures including first multilayer interconnects formed under the lenses in the first region; and second insulating structures including second multilayer interconnects formed under the embossing structures in the second region.

9. The image sensor of claim 1, wherein the lenses are formed for the photoelectric conversion elements.

10. The image sensor of claim 1, further comprising:

a planarization film formed in the first and second regions, with the lenses formed on the planarization film in the first region, and with the embossing structures formed on the planarization film in the second region.

11. The image sensor of claim 10, wherein the protective layer is formed onto portions of the planarization film between the embossing structures in the second region.

12. The image sensor of claim 10, wherein the protective layer is formed onto portions of the planarization film between the lenses in the first region.

13. The image sensor of claim 1, wherein the lenses and the embossing structures are comprised of a same material.

14. The image sensor of claim 13, wherein the lenses and the embossing structures are comprised of an organic material.

15. The image sensor of claim 1, wherein the lenses in the first region are at a different height from the embossing structures in the second region.

16. The image sensor of claim 15, wherein the lenses in the first region are at a lower height from the embossing structures in the second region.

17. The image sensor of claim 1, further comprising:

a respective light-transmissive portion formed over each photoelectric conversion element and below a respective lens in the first region.

18. The image sensor of claim 17, wherein the photoelectric conversion elements are photodiodes.

* * * * *